(12) United States Patent
Cauley et al.

(10) Patent No.: US 10,909,732 B2
(45) Date of Patent: Feb. 2, 2021

(54) SYSTEMS AND METHODS FOR JOINT IMAGE RECONSTRUCTION AND MOTION ESTIMATION IN MAGNETIC RESONANCE IMAGING

(71) Applicant: THE GENERAL HOSPITAL CORPORATION, Boston, MA (US)

(72) Inventors: Stephen Cauley, Cambridge, MA (US); Melissa Haskell, Cambridge, MA (US); Lawrence L. Wald, Cambridge, MA (US)

(73) Assignee: The General Hospital Corporation, Boston, MA (US)

( * ) Notice: Subject to any disclaimer, the term of this patent is extended or adjusted under 35 U.S.C. 154(b) by 143 days.

(21) Appl. No.: 16/073,699

(22) PCT Filed: Jan. 30, 2017

(86) PCT No.: PCT/US2017/015562
§ 371 (c)(1),
(2) Date: Jul. 27, 2018

(87) PCT Pub. No.: WO2017/132648
PCT Pub. Date: Aug. 3, 2017

(65) Prior Publication Data
US 2019/0035119 A1    Jan. 31, 2019

Related U.S. Application Data

(60) Provisional application No. 62/288,624, filed on Jan. 29, 2016.

(51) Int. Cl.
*G06K 9/00* (2006.01)
*G06T 11/00* (2006.01)
(Continued)

(52) U.S. Cl.
CPC ........ *G06T 11/008* (2013.01); *G01R 33/5608* (2013.01); *G01R 33/5611* (2013.01);
(Continued)

(58) Field of Classification Search
CPC ..... A61B 6/5258; A61B 6/5264; A61B 6/527; A61B 8/5276; G06T 2207/10088; G06T 2207/10072; G01R 33/5608
See application file for complete search history.

(56) References Cited

U.S. PATENT DOCUMENTS

| 9,336,614 B1 * | 5/2016 | Wollenweber | ........ G06T 11/008 |
| 2008/0051648 A1 * | 2/2008 | Suri | ...................... A61B 6/5235 600/407 |

(Continued)

FOREIGN PATENT DOCUMENTS

| WO | WO-2015110909 A1 * | 7/2015 | ....... G01R 33/56509 |
| WO | WO 2015110909 A1 | 7/2015 | |

OTHER PUBLICATIONS

Menini, Anne, et al. "Joint reconstruction of image and motion in MRI: implicit regularization using an adaptive 3D mesh." International Conference on Medical Image Computing and Computer-Assisted Intervention. Springer, Berlin, Heidelberg, 2012. (Year: 2012).*

(Continued)

*Primary Examiner* — Avinash Yentrapati
(74) *Attorney, Agent, or Firm* — Quarles & Brady LLP

(57) ABSTRACT

Described here are systems and methods for retrospectively estimating and correcting for rigid-body motion by using a joint optimization technique to jointly solve for motion parameters and the underlying image. This method is implemented for magnetic resonance imaging ("MRI"), but can also be adapted for other imaging modalities.

17 Claims, 4 Drawing Sheets

(51) Int. Cl.
*G01R 33/565* (2006.01)
*G06T 5/50* (2006.01)
*G06K 9/40* (2006.01)
*G06T 5/00* (2006.01)
*G01R 33/561* (2006.01)
*G06T 7/13* (2017.01)
*G01R 33/56* (2006.01)
*G06T 15/08* (2011.01)

(52) U.S. Cl.
CPC ... *G01R 33/56509* (2013.01); *G06K 9/00201* (2013.01); *G06K 9/00335* (2013.01); *G06K 9/40* (2013.01); *G06T 5/003* (2013.01); *G06T 5/50* (2013.01); *G06T 7/13* (2017.01); *G06T 15/08* (2013.01); *G06T 2207/10088* (2013.01); *G06T 2207/20201* (2013.01); *G06T 2211/424* (2013.01)

(56) References Cited

U.S. PATENT DOCUMENTS

| | | | | |
|---|---|---|---|---|
| 2010/0152568 | A1* | 6/2010 | Kokubun | A61B 5/721 600/410 |
| 2011/0150305 | A1* | 6/2011 | Zeng | G06T 11/005 382/131 |
| 2012/0029396 | A1* | 2/2012 | Vortman | A61N 7/02 601/2 |
| 2012/0148128 | A1* | 6/2012 | Chefd'hotel | G01R 33/56509 382/131 |
| 2012/0235679 | A1 | 9/2012 | Xue et al. | |
| 2014/0010431 | A1* | 1/2014 | Stayman | G06T 11/006 382/131 |
| 2014/0126796 | A1 | 5/2014 | Chesneau et al. | |
| 2014/0219531 | A1* | 8/2014 | Epstein | G06T 7/20 382/131 |
| 2014/0355855 | A1* | 12/2014 | Miao | A61B 5/721 382/131 |
| 2015/0117733 | A1* | 4/2015 | Manjeshwar | G06T 11/005 382/131 |
| 2016/0180553 | A1* | 6/2016 | Edic | A61B 5/0035 382/107 |
| 2016/0210741 | A1* | 7/2016 | Brendel | A61B 6/032 |
| 2018/0014725 | A1* | 1/2018 | Bagherinia | A61B 3/102 |
| 2019/0261940 | A1* | 8/2019 | Son | A61B 6/463 |

OTHER PUBLICATIONS

International Search Report and Written Opinion for International Application No. PCT/US2017/015562 dated Apr. 21, 2017, 19 pages.

* cited by examiner

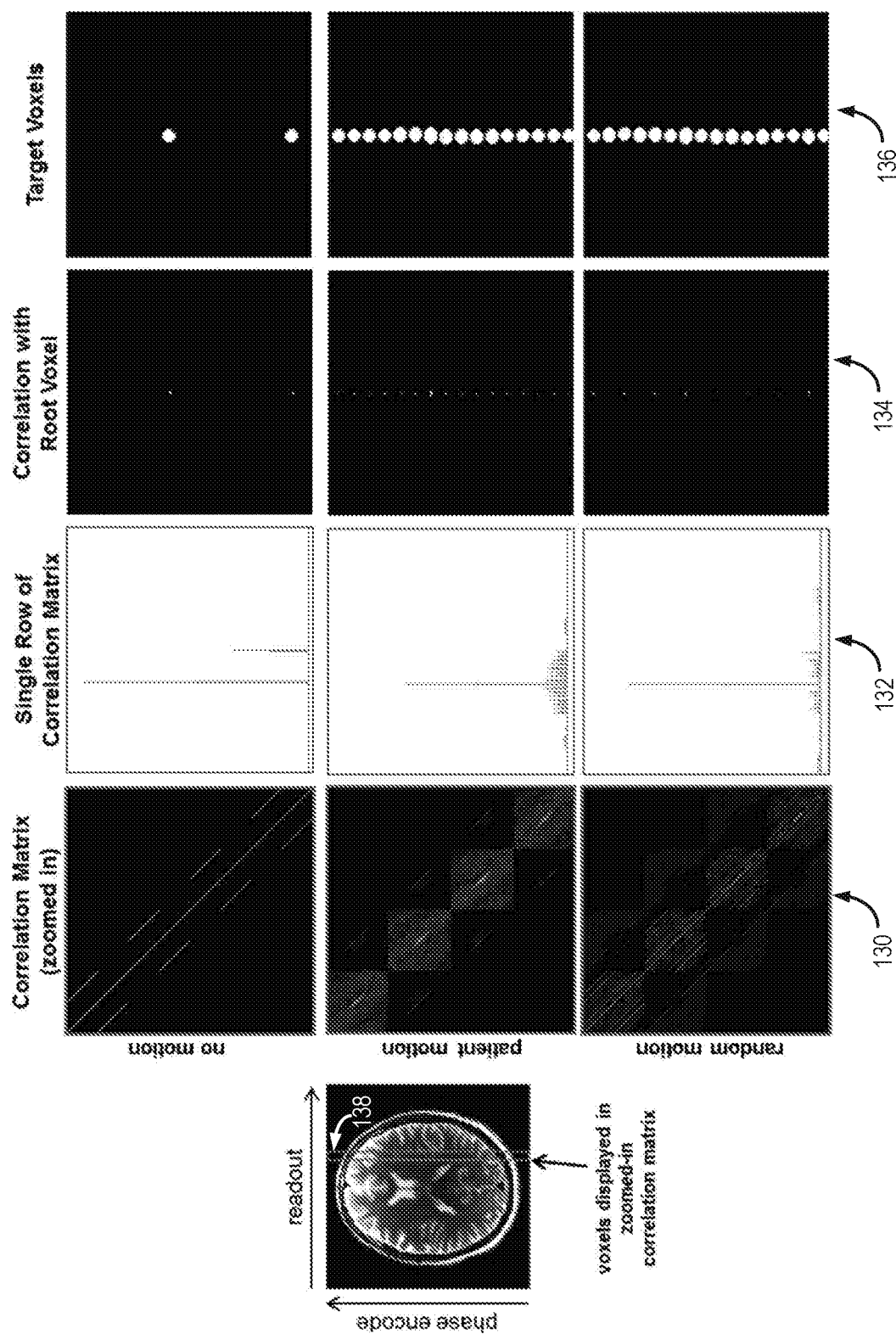

SYSTEMS AND METHODS FOR JOINT IMAGE RECONSTRUCTION AND MOTION ESTIMATION IN MAGNETIC RESONANCE IMAGING

CROSS-REFERENCE TO RELATED APPLICATIONS

This application represents the national stage entry of PCT International Application No. PCT/US2017/015562 filed Jan. 30, 2017, which is based on, claims priority to, and incorporates herein by reference in its entirety, U.S. Application Ser. No. 62/288,624, filed Jan. 29, 2016, and entitled "SYSTEMS AND METHODS FOR JOINT IMAGE RECONSTRUCTION AND MOTION ESTIMATION IN MAGNETIC RESONANCE IMAGING."

STATEMENT REGARDING FEDERALLY SPONSORED RESEARCH

This invention was made with government support under EB015896, MH093765, and EB017337 awarded by the National Institutes of Health. The government has certain rights in the invention.

BACKGROUND

The field of the invention is systems and methods for magnetic resonance imaging ("MRI"). More particularly, the invention relates to systems and methods for joint image reconstruction and motion estimation and correction in MRI applications.

Patient motion during MRI scans causes image artifacts that degrade diagnostic utility, which often requires patient callbacks or, more commonly, lost diagnostic potential. The effects of patient motion are present on nearly every examination, since no patient can hold still to the millimeter level (the resolution of a typical MR image) for 3-5 minutes.

Many methods to detect and correct for motion in MRI have been proposed, but none of the techniques have gained traction in the clinic except for placing the patient under general anesthesia, a procedure that more than doubles the cost of the scan and magnifies the risk of the imaging procedure multi-fold.

Other methods include the use of motion detection markers and devices, such as video tracking systems, or MR navigators which feed-back rigid-body motion parameters to the scanner and thus update the image coordinate system in real-time. Markers have failed for various reasons, including the difficulty of robustly attaching them to a patient (often a relatively direct attachment to bone is needed to differentiate skin motion from core head movement). Motion correction using MR navigator scans suffers from low sensitivity and can disrupt of the optimal timing of the MR pulse sequence into which they are inserted.

Thus, there remains a need to providing methods for MRI in which the effects of motion can be accurately mitigated in a reliable, repeatable, and non-time-consuming manner.

SUMMARY

The present disclosure provides systems and methods that overcome the aforementioned drawbacks by providing an image reconstruction and motion estimation process that implements a joint optimization of the final image and motion parameters. The reconstruction can operate on motion-corrupted k-space data. The joint optimization described here is capable of finding subject motion parameters along with the corresponding uncorrupted image to be reconstructed through a parallel imaging formulation.

In accordance with one aspect of the disclosure, a method is provided for producing an image of a subject using magnetic resonance imaging (MRI) data. The method includes (a) providing k-space data acquired from a subject with an MRI system during a time in which the subject was moving, (b) reconstructing a motion-corrupted image of the subject from the k-space data, and (c) determining a reduced set of voxels in the motion-corrupted image. The method also includes (d) jointly estimating motion parameters and reconstructing a targeted set of image voxels associated with the reduced set of voxels and depicting the subject. The artifacts associated with subject motion are mitigated by iteratively performing the steps of (i) estimating the motion parameters associated with motion in the reduced set of voxels and (ii) reconstructing the targeted set of image voxels depicting the subject using the motion parameters estimated in step (d)(i) and evaluating a data consistency quality. The method further includes (e) reconstructing a substantially motion-free image of the subject using the provided k-space data and the motion parameters estimated in step (d)(i).

In accordance with another aspect of the disclosure, the initial steps of the optimization can be used as a tool for identifying the presence of motion in the k-space data. For instance, if the gradient of the data consistency objective is small, the image can be deemed to be motion-free; otherwise, the image can be classified as being corrupted by motion and in need of correction.

In accordance with another aspect of the disclosure, a magnetic resonance imaging ("MRI") system is provided that includes a magnet system configured to generate a polarizing magnetic field about at least a region of interest ("ROI") of a subject arranged in the MRI system. The MRI system also includes a plurality of gradient coils configured to apply a gradient field with respect to the polarizing magnetic field, a radio frequency ("RF") system configured to apply RF excitation fields to the subject and acquire MR image data therefrom, and a computer. The computer is programmed to control the plurality of gradient coils and the RF system to acquire k-space data from the subject during a time in which the subject was moving, reconstruct a motion-corrupted image of the subject from the k-space data, and select a reduced set of voxels in the motion-corrupted image that are coupled. The computer is also configured to jointly estimate motion parameters and reconstruct an image of the subject that includes less motion artifacts than the motion-corrupted image. The computer achieves this by (i) estimating the motion parameters associated with motion in the reduced set of voxels, (ii) reconstructing a targeted set of image voxels depicting the subject using the motion parameters and evaluating a data consistency quality, (iii) evaluating a data consistency parameter to determine whether to iterate through (i) and (ii) for a current set of image voxels or another set of voxels.

In accordance with yet another aspect of the disclosure, a method is provided for producing an image of a subject using magnetic resonance imaging (MRI). The method includes (a) providing k-space data acquired from a subject with an MRI system during a time in which at least a portion of the subject is in motion, (b) reconstructing a motion-corrupted image of the subject from the k-space data, and (c) determining a reduced set of voxels in the motion-corrupted image that are coupled by the motion of the subject. The method also includes (d) performing a parallel imaging reconstruction process to jointly estimate motion parameters describing the motion of the subject and reconstruct target image voxels associated with the reduced set of voxels and (e) repeating step (c) and step (d) to create an image of the subject from the k-space data that is not corrupted by the motion of the subject.

The foregoing and other aspects and advantages of the invention will appear from the following description. In the description, reference is made to the accompanying drawings that form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 1C is an image and associated set of images showing voxel properties that can be considered for selecting subsets of voxels for use in reconstruction processes such as described with respect to FIGS. 1A and 1B.

DETAILED DESCRIPTION

Figure 1A:
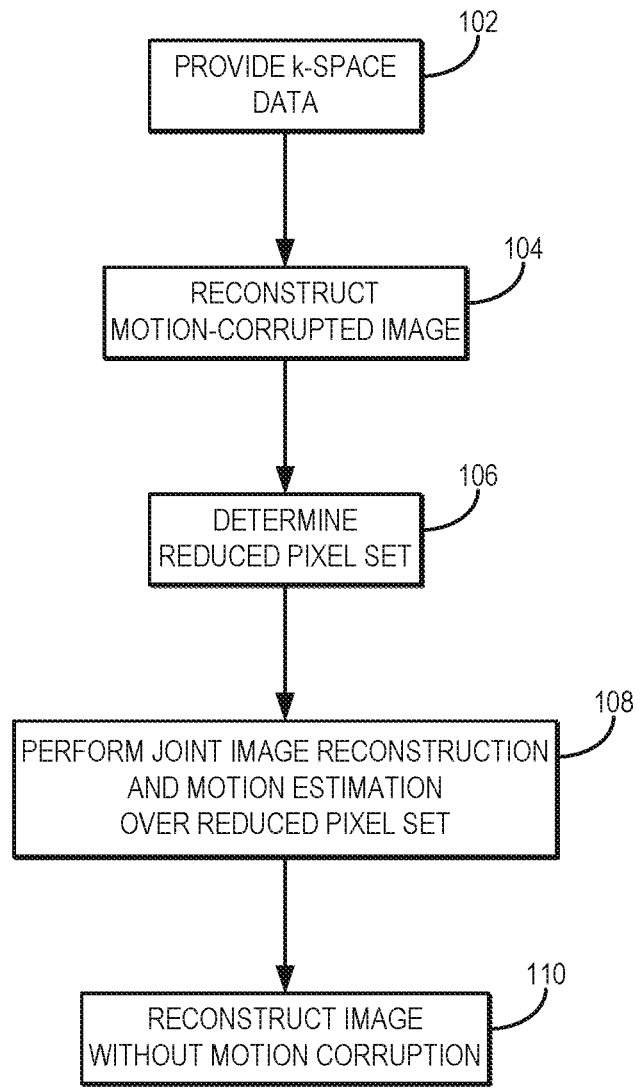
FIG. 1A is a flowchart setting forth the steps of an example method for jointly estimating motion parameters and reconstruction an image from data acquired with a magnetic resonance imaging ("MRI") system.

Described here are systems and methods for retrospectively estimating and correcting for subject motion, such as rigid-body motion, by using a joint optimization technique to jointly solve for motion parameters and the underlying image. This technique will be described with respect to magnetic resonance imaging ("MRI"), but can also be adapted for other imaging modalities. In some instances, the method can be referred to as targeted motion estimation and reduction ("TAMER"). The TAMER method does not require prior motion information, but the efficiency of the method can be enhanced with the inclusion of noisy or incomplete navigator or detector measurements into the forward model. The TAMER method can use a targeted application of the underlying parallel imaging data consistency model for motion estimation and correction through model reduction and fast optimization techniques, as will be described below in more detail.

One way to formulate the standard magnetic resonance image reconstruction is to form an encoding matrix that describes the signal detected. The detected signal can be represented as a signal vector formed from all the k-space signal measurements at each time point. The object (image) can also be represented as a vector by arranging all of the pixels in the object as a vector. The image encoding matrix, determined at least in part from the gradient trajectory and receive coil profiles, represents the transformation of the image vector to form the signal vector. If multiple receive coils are used, the image and signal vector can be represented as the concatenated vectors for each coil, and the rows of the encoding matrix are similarly increased. In standard MRI, the encoding matrix is the discrete Fourier transform ("DFT") (weighted by receive coil profiles). Thus, in a simple case, the object vector can then be computed in a number of ways, including by applying the inverse DFT (uniform reception coil) or by solving an optimization problem that seeks the object vector most consistent with (for example, with respect to a least-squares context) the observed data (i.e., the signal vector) and the forward model.

The standard reconstruction method assumes the object is stationary; however, the reconstruction problem can be modified to add a set of parameters that describes the relative rigid body position of the object at every acquisition time point, or at least at the time of each k-space line acquisition. If a non-rigid body motion is expected, this motion can also be included as a more complex parameterization describing the subject's motion. For the rigid body case, if $N_{PE}$ lines of k-space are acquired (i.e., $N_{PE}$ timepoints), then this adds $6 \times N_{PE}$ unknowns to the reconstruction problem, where the factor of six represents the six rotation and translation parameters needed to describe rigid body motion, which occurs in the time between the k-space acquisitions. The rigid body motion can be thought of as rotation and translation matrices applied to the object vector, and can be includes into the encoding matrix. Described in this way, the object vector can be viewed as representing the object in a stationary frame, and reconstructing this vector constitutes reconstructing an image that is not corrupted by the motion.

The reconstruction methods described here can be used to implement an optimization problem that seeks to solve for both the object vector and the motion parameters that describe the object's motion history during the scan. So long as sufficient data exists to estimate both the motion and object pixels, the reconstructed image will be free of motion corruption.

Advantageously, the systems and methods described here provide a reconstruction technique that considers the subject's movement to be part of the parallel imaging reconstruction problem, and can use motion navigators, or other tracking information that is available, as extra information to improve the computational efficiency of the method. Reduced models for motion trajectories and images can allow for the formulation of a compact joint optimization model, and the use of targeted parameter sets can improve motion estimates by removing noisy or degenerate information. The reduced model parameters can also allow for efficient optimization on standard vendor hardware.

In general, the TAMER image reconstruction and motion estimation process described herein implements a joint optimization of the final image and motion parameters. An efficient method for reconstruction from motion-corrupted k-space data is provided by examining iterative improvements to a small, targeted subset of image voxels.

The joint optimization described here is thus capable of finding subject motion parameters along with the corresponding image to be reconstructed through a parallel imaging formulation. That is, the optimization considers the modeling parameters needed to describe both the image and the subject motion trajectory in order to ensure a robust reconstruction. By solving for both the motion parameters and the image, the typical image reconstruction assumption that the object is stationary can be removed, thereby allowing the imaging of moving objects. These two different types of unknowns are solved for in a joint estimation strategy. The extra degrees of freedom provided by parallel imaging (e.g., the multiple coil detector's information) are used to make up for the added number of unknowns. It is also possible to include incomplete or noisy information from motion navigators or motion sensors to help the joint estimation process; however, this additional information is not required.

Referring now to FIG. 1A, a flowchart is illustrated as setting forth the steps of an example method for reconstructing an image of a subject using a joint optimization technique that iteratively estimates motion parameters while reconstructing the image, such that a non-motion-corrupted image is reconstructed.

The method includes providing k-space data from which an image of the subject is to be reconstructed, as indicated at step 102. In some instances, the k-space can be provided by retrieving previously acquired k-space data from a data storage and providing the retrieved data to a computer system for reconstruction. In some other instances, the k-space data can be provided by acquiring the k-space data with an MRI system and providing the acquired k-space data to a computer system for reconstruction.

From the k-space data, a motion-corrupted image of the subject is reconstructed, as indicated at step 104. As an example, the motion-corrupted image can be reconstructed using conventional image reconstruction techniques. As indicated at step 106, the motion-corrupted image is then processed to determine pixels-of-interest, which form a reduced pixel set, that represent the regions of the motion-corrupted image that are most highly sensitive to motion corruption. In general, the pixels-of-interest (typically a very small percentage of the total image pixels) can be selected by identifying high signal regions or by adding small random motion to highlight motion susceptible pixels. As will be described below, the joint optimization is restricted to these image-space areas in order to remove degeneracy in the solution space and ensure final solution quality, as well as to improve the computational performance of the joint estimation process.

As one example, the reduced pixel set can be determined by starting with a motion-free model (i.e., the motion-corrupted image) and performing several random experiments where the reconstruction problem is solved with random motion parameter sets. This can be thought of as a form of random input system identification, where the deviation from the motion-free model shows the most sensitive regions of the image to all possible forms of motion corruption. Other heuristic methods, such as edge detection or image segmentation, can also be used to identify regions-of-interest from the original motion-corrupted image.

The targeted image voxels from the subject are then reconstructed while jointly estimating motion parameters, as indicated at step 108. As one example, the following joint optimization problem can be minimized to this effect, $$\operatorname*{argmin}_{x,M} \sum_{i=1}^{N} \|UFC_i Mx - k_i\|_2; \quad (1)$$

where M are the motion parameters, U is a k-space undersampling operator, F is a Fourier transform operator, $C_i$ is coil sensitivity information for the $i^{th}$ receive coil in an array of N receive coils, x is the targeted image voxels, and $k_i$ is the k-space data acquired by the $i^{th}$ receive coil. This joint optimization is first performed over the reduced voxel set to remove degeneracy in the solution space while ensuring sufficient final solution quality. In addition, this reduced modeling ameliorates the computational challenge associated with non-linear optimization across large parameter sets. As one example, for each iteration of TAMER, a greedy search can be used to sequentially determine an estimate of the motion parameters at each shot. The solution of this search can be used to jumpstart a global optimization for all motion parameters across the reduced voxel set, as described below.

It will be appreciated by those skilled in the art that there are also a variety of other non-linear least squares techniques that can be utilized to solve this joint problem, including Levenberg-Marquardt, trust-regions, stochastic genetic algorithm, simulated annealing, and Bayesian methods. Although these algorithms can be computationally prohibitive when the number of parameters grows, and can also converge to poor quality local optima, by exploiting reduced models for the imaging voxels and motion parameters, the joint optimization can be made computationally tractable. Likewise, these reduced models can limit the scope of the solution space to high quality solutions.

Performing the initial search for motion parameters over the reduced pixel set as described above is one way to implement a reduced model for the image variable, x. By using this reduced number of voxels for the joint optimization, we have not only significantly improved the computational efficiency but also removed noisy and/or degenerate information from the objective function calculation.

Model reduction can also be used to limit the number of parameters used to represent the motion trajectory. As one example, the subject motion trajectory (or subsets of the motion trajectories) can be described through a sparse set of frequencies (e.g., smooth motion) and a sparse set of motion discontinuities (e.g., rapid motion jump). Other reduced parameter basis sets (e.g., recursive polynomials, splines) can also be incorporated.

In addition, any motion navigators acquired during the data acquisition process can be used to initialize coefficients for the motion trajectory, or as complimentary data to offset the increased number of unknowns in the reconstruction problem.

Referring again to FIG. 1, after performing joint optimization over the reduced pixel set, the joint optimization can then be performed by evaluating the data consistency subject to changes in the reduced motion parameter set and limited number of imaging voxels. At each evaluation in either a greedy or global search, data consistency is only considered across the reduced pixel set. Upon convergence of the algorithm, the final motion parameters are used to arrive at a motion-free image, as indicated at step 110. As one example, the motion-free image can be obtained by solving a parallel image reconstruction, such as:

$$x_{final} = \operatorname*{argmin}_{x} \sum_{i=1}^{N} \|UFC_i M_{final} x - k_i\|_2. \quad (2)$$

Figure 1B:
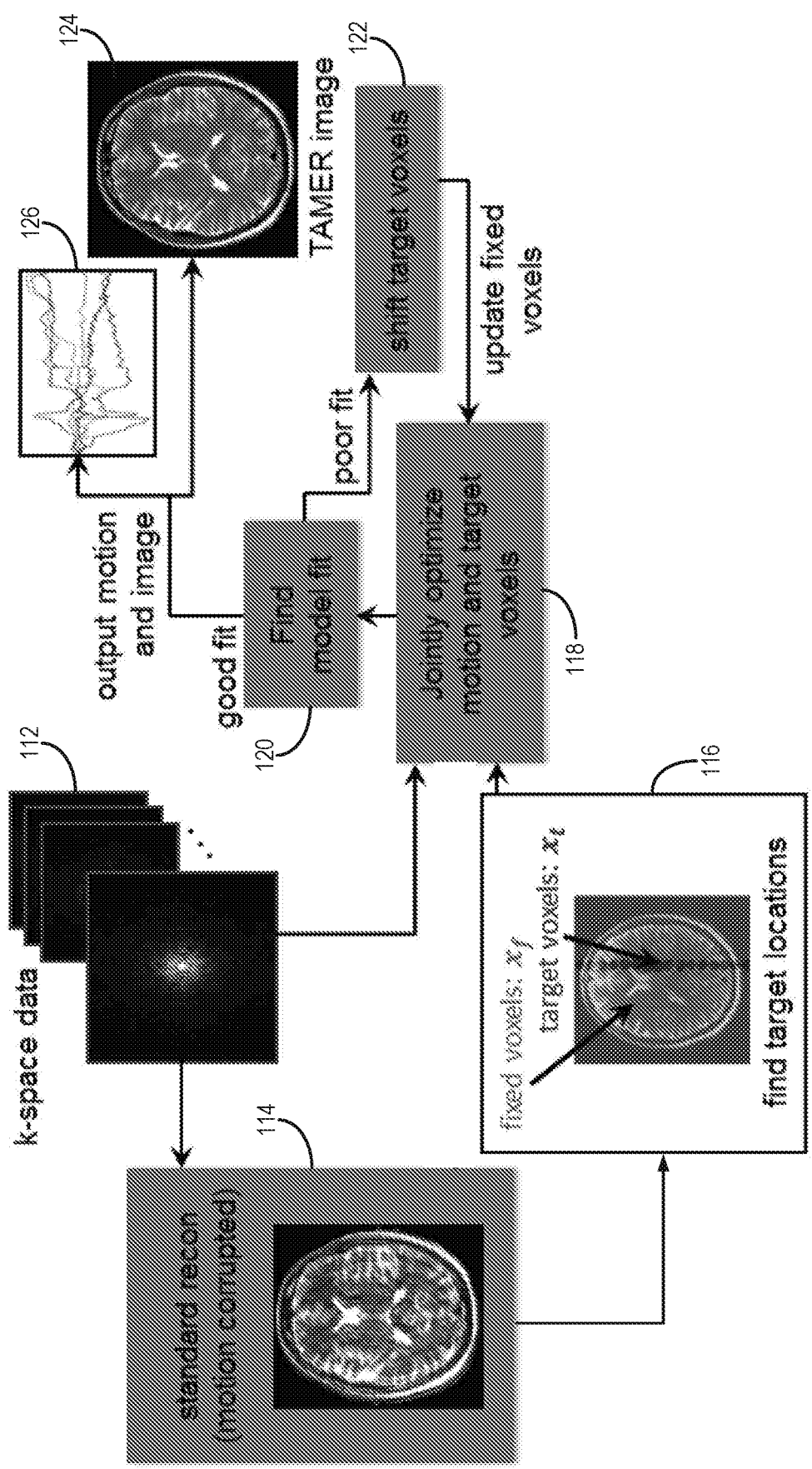
FIG. 1B is a schematic flow diagram for an image reconstruction process in accordance with the present disclosure.

Referring to FIG. 1B, the above-described process, which may be referred to as the TAMER method, explicitly incorporates rigid-body patient motion in the MR forward model, and jointly estimates the image and motion trajectory by minimizing data consistency error. As described, above, the TAMER method begins by acquiring, whether newly acquired or stored, motion corrupted data 112 that is used to reconstruct an initial image guess assuming no motion has occurred 114, and initial target voxels are estimated 116. The patient motion trajectory and a target subset of voxels are jointly optimized 118 by minimizing data consistency error 120, 122. Specifically, as the optimization loop progresses, the target voxels are shifted 122 and the fast reduced model minimization continues searching for the motion trajectory.

Once TAMER converges to the final motion the full image is reconstructed using the motion estimate. To this end, both an image that is free of motion 124 and a motion signal or waveform 126 can be generated.

Thus, the TAMER method explicitly incorporates parameterized motion, which may be rigid-body patient motion, in the MR forward model, and jointly estimates the image and motion trajectory by minimizing data consistency error. A generalized SENSE forward model given by $s=E_\theta x$ may be assumed, where s is the acquired signal; $E_\theta$ is the encoding for a given motion trajectory, $\theta$; and x is the motion free image. The encoding can be expanded as $E_\theta = UFCTR$, where C contains the coil sensitivities, F is the Fourier encoding operator, U is the undersampling operator (allowing parallel imaging acceleration), and R and T describe the rotations and translations at each shot, respectively. Since the joint optimization (image and motion) is computationally intensive, a reduced model representation can be used that jointly optimizes only small subsets of "targeted" voxels, $x_t$, and the object position parameters (6 parameters per shot). The targeted voxels are varied during the optimization.

In the absence of motion, only a single least-squares minimization of $\|s-Ex\|_2$, is needed. With motion unknowns, the non-linear estimation problem increases in complexity. By solving only a small targeted subset of voxels at each step the joint optimization is more computationally efficient. Breaking the image into a targeted subset, $x_t$, and the complimentary "fixed" subset, $x_f$, allows the signal from the targeted voxels, $s_t$, to be isolated from the total signal (i.e., $s_t=s-s_f$; here $s_f$ is the signal contribution from the fixed voxels). The forward model evaluation for each motion estimate can be reduced to $s_t=E_{\theta,t}$ where $E_{\theta,t}$ is the portion of the encoding acting only on the target voxels. The reduced model data consistency minimization is now:

$$[\hat{\theta}, \hat{x}_t] = \underset{\theta, x_t}{\mathrm{argmin}} \|s_t - E_{\theta,t} x_t\|_2. \quad (3)$$

Regularization, such as, Tikhonov/spatial sparsity, or an enforcement of sparsity in other domains, or the enforcement of some other prior knowledge about the image can also be added.

The above-described TAMER method robustly reconstructs (MRI) data that was acquired while a patient was moving by jointly optimizing a subset of the underlying image and the patient motion trajectory. To further improve performance in particular implementations, a mathematical framework may be used to select specific voxel subsets used in the jointly optimization with the motion parameters. In particular, as will be described, the voxels can be selected by examining the structure of the encoding model, which reveals the voxel coupling properties.

Voxel coupling in MRI occurs whenever there is patient motion or undersampling, and is dependent on the imaging sequence being used. For a motion-free image that is not undersampled, each voxel is only coupled to itself, and can be found with a simple inverse Fourier transform of the raw data. However, in the case of patient motion each voxel is coupled to its neighbors and to overlapping aliased voxels. This voxel coupling is built into the motion inclusive encoding matrix, E, that maps the image to the signal (i.e., $s=Ex$, where s is the signal acquired and x is the underlying object).

Since the underlying image, x, is found using least-squares minimization by solving the normal equations, $E^H s = E^H E x$, the structure of the correlation matrix, $E^H E$, determines how the values in x are coupled to one another. If voxels in x are only coupled to a small number of other voxels, then the correlation matrix will be sparse, signifying large model separability. In the case of the above-described motion-inclusive forward model, there is similar model separability for patient motion trajectories and random motion. This property can be exploited to find subsets of voxels that are highly coupled during patient motion by adding random motion to the encoding model, without a priori knowledge of the true patient motion trajectory.

A given subset of voxels is found by selecting a so called "root" voxel, and the corresponding column of $E^H E$ that contains the contribution of each voxel to the root voxel. The voxels are thresholded so that only voxels of a given contribution magnitude are kept in the subset, and then the voxels are smoothed in image space to include other neighboring voxels. As the joint optimization searches for the underlying patient motion, the subset of voxels that are jointly optimized with the motion are continuously updated. As the motion search progresses, all the voxels in the image will be optimized using this method. Continuously updating the voxel subset allows the search for motion to proceed without solving for the entire image, increasing the efficiency of the joint optimization.

Thus, overall accuracy of the reduced model can depend on locality properties in the motion-inclusive encoding matrix. Target voxel coupling can be examined in the correlation matrix, $E^H E$, where sparsity arises from model separability. FIG. 1C shows a subset of $E^H E$ for no motion, measured patient motion, and random motion, all for RARE imaging with R=2 undersampling. Specifically, in column 130, the correlation matrix ($E_\theta^H E_\theta$) for the voxels identified by box 138 in the image on the left hand side of the figure are shown (log scale). In column 132, a single row of the correlation matrix is plotted for a given root voxel (linear scale). In column 134, the magnitude of each voxel's correlation to the root voxel is plotted in image space (log scale). Finally, in column 136, the target voxels are chosen by thresholding the correlation values and smoothed. The motion values used in the second row are from the motion trajectory measured during an fMRI scan of a patient with Alzheimer's disease As illustrated, the measured-patient and random motion cases show very similar sparsity patterns, and therefor similar model separability. The TAMER technique exploits this property to find subsets of voxels that are highly coupled by adding random motion to the forward model, without a priori knowledge of the true motion trajectory. That is, the approximate sparsity in the encoding matrix under random motion allows for the selection of small targeted subsets of voxels Phantom tests were performed using an in-plane rotating pineapple phantom using a continuous motion actuator throughout the scan, approximately ±3°; ETL=11, 230×208 mm2 FOV, 0.6×0.6 mm$^2$ resolution, 5 mm slice thickness, TR/TE=3.8 s/93 ms, refocus pulse=150°, and R=1. The above-described TAMER technique was also tested on a human subject using ETL=11, 220×220 mm$^2$ FOV, 0.9×0.9 mm$^2$ resolution, 3 mm slice thickness, TR/TE=3.0 s/99 ms, refocus pulse=150°, and R=1. The subject was asked to shake their head in a "no" gesture during the middle of the scan.

Joint reconstruction using target voxels from FIG. 1C resulted in a 7×RMSE improvement for the heavily motion-coupled voxels compared to separate reconstruction. TAMER corrected rotating phantom images showing image space RMSE compared to a ground truth (no motion) image indicated a decrease from 17.4% to 10.0%. The TAMER reconstruction was able to resolve image features otherwise blurred by motion.

Thus, the effectiveness of the TAMER methods for mitigating motion were demonstrated in both rotating phantoms and moving human subjects. The TAMER method is able to estimate motion retrospectively using only parallel imaging data (i.e., without a priori knowledge of the subject motion). The per slice reconstruction time can be significantly reduced with a GPU implementation that caches the compact rotation, translation, and DFT operators, such as to provide an order of magnitude decrease in reconstruction time.

Figure 2:
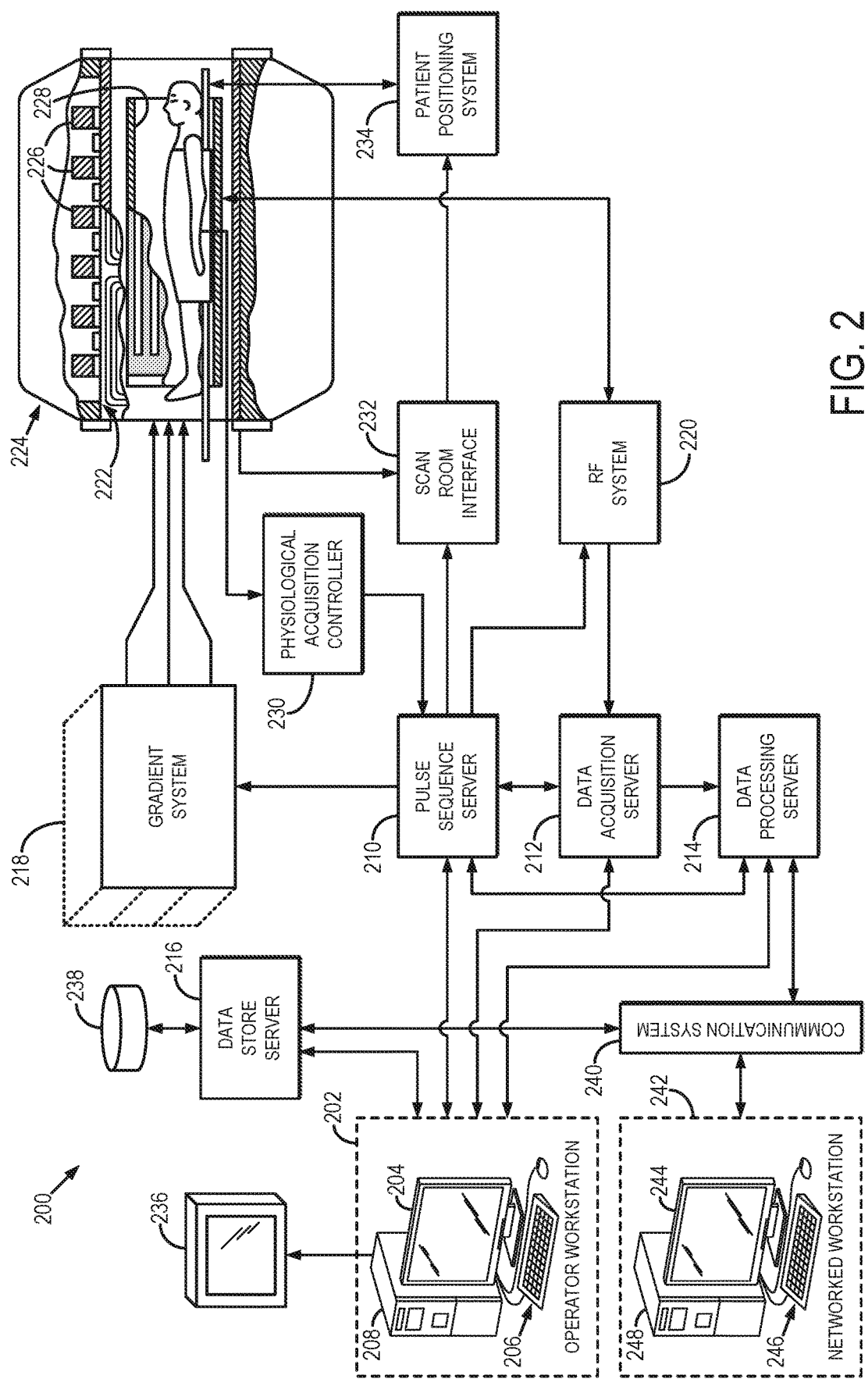
FIG. 2 is a block diagram of an example of a magnetic resonance imaging ("MRI") system.

Referring now to FIG. 2, an example of a magnetic resonance imaging ("MRI") system 200 is illustrated. The MRI system 200 includes an operator workstation 202, which will typically include a display 204; one or more input devices 206, such as a keyboard and mouse; and a processor 208. The processor 208 may include a commercially available programmable machine running a commercially available operating system. The operator workstation 202 provides the operator interface that enables scan prescriptions to be entered into the MRI system 200. In general, the operator workstation 202 may be coupled to four servers: a pulse sequence server 210; a data acquisition server 212; a data processing server 214; and a data store server 216. The operator workstation 202 and each server 210, 212, 214, and 216 are connected to communicate with each other. For example, the servers 210, 212, 214, and 216 may be connected via a communication system 240, which may include any suitable network connection, whether wired, wireless, or a combination of both. As an example, the communication system 240 may include both proprietary or dedicated networks, as well as open networks, such as the internet.

The pulse sequence server 210 functions in response to instructions downloaded from the operator workstation 202 to operate a gradient system 218 and a radiofrequency ("RF") system 220. Gradient waveforms necessary to perform the prescribed scan are produced and applied to the gradient system 218, which excites gradient coils in an assembly 222 to produce the magnetic field gradients $G_x$, $G_y$, and $G_z$ used for position encoding magnetic resonance signals. The gradient coil assembly 222 forms part of a magnet assembly 224 that includes a polarizing magnet 226 and a whole-body RF coil 228.

RF waveforms are applied by the RF system 220 to the RF coil 228, or a separate local coil (not shown in FIG. 2), in order to perform the prescribed magnetic resonance pulse sequence. Responsive magnetic resonance signals detected by the RF coil 228, or a separate local coil (not shown in FIG. 2), are received by the RF system 220, where they are amplified, demodulated, filtered, and digitized under direction of commands produced by the pulse sequence server 210. The RF system 220 includes an RF transmitter for producing a wide variety of RF pulses used in MRI pulse sequences. The RF transmitter is responsive to the scan prescription and direction from the pulse sequence server 210 to produce RF pulses of the desired frequency, phase, and pulse amplitude waveform. The generated RF pulses may be applied to the whole-body RF coil 228 or to one or more local coils or coil arrays (not shown in FIG. 2).

The RF system 220 also includes one or more RF receiver channels. Each RF receiver channel includes an RF preamplifier that amplifies the magnetic resonance signal received by the coil 228 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad (4);$$

and the phase of the received magnetic resonance signal may also be determined according to the following relationship:

$$\varphi = \tan^{-1}\left(\frac{Q}{I}\right). \qquad (5)$$

The pulse sequence server 210 also optionally receives patient data from a physiological acquisition controller 230. By way of example, the physiological acquisition controller 230 may receive signals from a number of different sensors connected to the patient, such as electrocardiograph ("ECG") signals from electrodes, or respiratory signals from a respiratory bellows or other respiratory monitoring device. Such signals are typically used by the pulse sequence server 210 to synchronize, or "gate," the performance of the scan with the subject's heart beat or respiration.

The pulse sequence server 210 also connects to a scan room interface circuit 232 that receives signals from various sensors associated with the condition of the patient and the magnet system. It is also through the scan room interface circuit 232 that a patient positioning system 234 receives commands to move the patient to desired positions during the scan.

The digitized magnetic resonance signal samples produced by the RF system 220 are received by the data acquisition server 212. The data acquisition server 212 operates in response to instructions downloaded from the operator workstation 202 to receive the real-time magnetic resonance data and provide buffer storage, such that no data is lost by data overrun. In some scans, the data acquisition server 212 does little more than pass the acquired magnetic resonance data to the data processor server 214. However, in scans that require information derived from acquired magnetic resonance data to control the further performance of the scan, the data acquisition server 212 is programmed to produce such information and convey it to the pulse sequence server 210. For example, during prescans, magnetic resonance data is acquired and used to calibrate the pulse sequence performed by the pulse sequence server 210. As another example, navigator signals may be acquired and used to adjust the operating parameters of the RF system 220 or the gradient system 218, or to control the view order in which k-space is sampled. In still another example, the data acquisition server 212 may also be employed to process magnetic resonance signals used to detect the arrival of a contrast agent in a magnetic resonance angiography ("MRA") scan. By way of example, the data acquisition server 212 acquires magnetic resonance data and processes it in real-time to produce information that is used to control the scan.

The data processing server 214 receives magnetic resonance data from the data acquisition server 212 and processes it in accordance with instructions downloaded from the operator workstation 202. Such processing may, for example, include one or more of the following: reconstructing two-dimensional or three-dimensional images by performing a Fourier transformation of raw k-space data; performing other image reconstruction algorithms, such as iterative or backprojection reconstruction algorithms; applying filters to raw k-space data or to reconstructed images; generating functional magnetic resonance images; calculating motion or flow images; and so on.

Images reconstructed by the data processing server 214 are conveyed back to the operator workstation 202 where they are stored. Real-time images are stored in a data base memory cache (not shown in FIG. 2), from which they may be output to operator display 202 or a display 236 that is located near the magnet assembly 224 for use by attending physicians. Batch mode images or selected real time images are stored in a host database on disc storage 238. When such images have been reconstructed and transferred to storage, the data processing server 214 notifies the data store server 216 on the operator workstation 202. The operator workstation 202 may be used by an operator to archive the images, produce films, or send the images via a network to other facilities.

The MRI system 200 may also include one or more networked workstations 242. By way of example, a networked workstation 242 may include a display 244; one or more input devices 246, such as a keyboard and mouse; and a processor 248. The networked workstation 242 may be located within the same facility as the operator workstation 202, or in a different facility, such as a different healthcare institution or clinic.

The networked workstation 242, whether within the same facility or in a different facility as the operator workstation 202, may gain remote access to the data processing server 214 or data store server 216 via the communication system 240. Accordingly, multiple networked workstations 242 may have access to the data processing server 214 and the data store server 216. In this manner, magnetic resonance data, reconstructed images, or other data may be exchanged between the data processing server 214 or the data store server 216 and the networked workstations 242, such that the data or images may be remotely processed by a networked workstation 242. This data may be exchanged in any suitable format, such as in accordance with the transmission control protocol ("TCP"), the internet protocol ("IP"), or other known or suitable protocols.

The present invention has been described in terms of one or more preferred embodiments, and it should be appreciated that many equivalents, alternatives, variations, and modifications, aside from those expressly stated, are possible and within the scope of the invention.

The invention claimed is:

1. A method for producing an image of a subject using magnetic resonance imaging (MRI), the steps of the method comprising:
    (a) providing k-space data acquired from a subject with an MM system during a time in which the subject was moving;
    (b) reconstructing a motion-corrupted image of the subject from the k-space data;
    (c) determining a reduced set of voxels in the motion-corrupted image;
    (d) jointly estimating motion parameters and reconstructing a targeted set of image voxels associated with the reduced set of voxels and depicting the subject, wherein artifacts associated with subject motion are mitigated by iteratively performing the steps of:
        (i) estimating the motion parameters associated with motion in the reduced set of voxels;
        (ii) reconstructing the targeted set of image voxels depicting the subject using the motion parameters estimated in step (d)(i) and evaluating a data consistency quality;
    (e) reconstructing a substantially motion-free image of the subject using the provided k-space data and the motion parameters estimated in step (d)(i); and
    wherein step (c) further includes at least one of:
    determining the reduced set of voxels by adding random motion to the motion-corrupted image to identify pixels that are susceptible to motion; or
    determining the reduced set of voxels by adding random motion to an encoding matrix and determining voxels that are highly coupled to each other.

2. The method as recited in claim 1, wherein step (c) includes selecting pixels in the motion-corrupted image having image intensity values above a threshold value.

3. The method as recited in claim 1, wherein step (c) includes determining the reduced set of voxels by performing an edge detection on the motion-corrupted image.

4. The method as recited in claim 1, wherein step (d) is performed subject to a consistency condition over the reduced set of voxels.

5. The method as recited in claim 1, wherein the reduced set of voxels is determined by identifying regions of the motion-corrupted image that are sensitive to motion corruption.

6. The method as recited in claim 5, wherein identifying regions of the motion-corrupted image that are sensitive to motion includes solving a reconstruction problem using random motion parameter sets.

7. A method for producing an image of a subject using magnetic resonance imaging (MRI), the steps of the method comprising:
    (a) providing k-space data acquired from a subject with an MM system during a time in which the subject was moving;
    (b) reconstructing a motion-corrupted image of the subject from the k-space data;
    (c) determining a reduced set of voxels in the motion-corrupted image;
    (d) jointly estimating motion parameters and reconstructing a targeted set of image voxels associated with the reduced set of voxels and depicting the subject, wherein artifacts associated with subject motion are mitigated by iteratively performing the steps of:
        (i) estimating the motion parameters associated with motion in the reduced set of voxels;
        (ii) reconstructing the targeted set of image voxels depicting the subject using the motion parameters estimated in step (d)(i) and evaluating a data consistency quality;
    (e) reconstructing a substantially motion-free image of the subject using the provided k-space data and the motion parameters estimated in step (d)(i); and
    wherein step (d) includes solving a joint optimization problem given by:

$$\operatorname*{argmin}_{x,M} \sum_{i=1}^{N} \|UFC_i Mx - k_i\|_2;$$

where M are the motion parameters, U is a k-space undersampling operator, F is a Fourier transform operator, $C_i$ is coil sensitivity information for the $i^{th}$ receive coil in an array of N receive coils, x is the targeted set of image voxels, and $k_i$ is the k-space data acquired by the $i^{th}$ receive coil.

8. A method for producing an image of a subject using magnetic resonance imaging (MRI), the steps of the method comprising:
   (a) providing k-space data acquired from a subject with an MM system during a time in which the subject was moving;
   (b) reconstructing a motion-corrupted image of the subject from the k-space data;
   (c) determining a reduced set of voxels in the motion-corrupted image;
   (d) jointly estimating motion parameters and reconstructing a targeted set of image voxels associated with the reduced set of voxels and depicting the subject, wherein artifacts associated with subject motion are mitigated by iteratively performing the steps of:
      (i) estimating the motion parameters associated with motion in the reduced set of voxels;
      (ii) reconstructing the targeted set of image voxels depicting the subject using the motion parameters estimated in step (d)(i) and evaluating a data consistency quality;
   (e) reconstructing a substantially motion-free image of the subject using the provided k-space data and the motion parameters estimated in step (d)(i); and
   wherein evaluating the data consistency quality includes solving a parallel image reconstruction given by:

$$x_{final} = \underset{x}{\operatorname{argmin}} \sum_{i=1}^{N} \|UFC_i M_{final} x - k_i\|_2;$$

where $M_{final}$ are final motion parameters that satisfy the data consistency quality, U is a k-space undersampling operator, F is a Fourier transform operator, $C_i$ is coil sensitivity information for the $i^{th}$ receive coil in an array of N receive coils, $x_{final}$ is a final image in the targeted set of image voxels, and $k_i$ is the k-space data acquired by the $i^{th}$ receive coil.

9. A magnetic resonance imaging ("MRI") system comprising:
   a magnet system configured to generate a polarizing magnetic field about at least a region of interest ("ROI") of a subject arranged in the MRI system;
   a plurality of gradient coils configured to apply a gradient field with respect to the polarizing magnetic field;
   a radio frequency ("RF") system configured to apply RF excitation fields to the subject and acquire MR image data therefrom; and
   a computer programmed to:
      control the plurality of gradient coils and the RF system to acquire k-space data from the subject during a time in which the subject was moving;
      reconstruct a motion-corrupted image of the subject from the k-space data;
      select a reduced set of voxels in the motion-corrupted image that are coupled;
      jointly estimate motion parameters and reconstruct an image of the subject that includes less motion that the motion-corrupted image by:
         (i) estimating the motion parameters associated with motion in the reduced set of voxels;
         (ii) reconstructing a targeted set of image voxels depicting the subject using the motion parameters and evaluating a data consistency quality;
         (iii) evaluating a data consistency parameter to determine whether to iterate through (i) and (ii) for a current set of image voxels or another set of voxels;
      wherein, to jointly estimate motion parameters and reconstruct an image of the subject, the computer is programmed to solve for both the object vector and the motion parameters that describe the object's motion history during the acquisition of the k-space data; and
      wherein, to select a reduced set of voxels, the computer is programmed to determine the reduced set of voxels by adding random motion to the motion-corrupted image to identify pixels that are susceptible to motion.

10. The MRI system as recited in claim 9, wherein the RF system includes a parallel imaging coil.

11. The MRI system as recited in claim 9, wherein, to select a reduced set of voxels, the computer is programmed to select pixels in the motion-corrupted image having image intensity values above a threshold value.

12. A magnetic resonance imaging ("MRI") system comprising:
   a magnet system configured to generate a polarizing magnetic field about at least a region of interest ("ROI") of a subject arranged in the MRI system;
   a plurality of gradient coils configured to apply a gradient field with respect to the polarizing magnetic field;
   a radio frequency ("RF") system configured to apply RF excitation fields to the subject and acquire MR image data therefrom; and
   a computer programmed to:
      control the plurality of gradient coils and the RF system to acquire k-space data from the subject during a time in which the subject was moving;
      reconstruct a motion-corrupted image of the subject from the k-space data;
      select a reduced set of voxels in the motion-corrupted image that are coupled;
      jointly estimate motion parameters and reconstruct an image of the subject that includes less motion that the motion-corrupted image by:
         (i) estimating the motion parameters associated with motion in the reduced set of voxels;
         (ii) reconstructing a targeted set of image voxels depicting the subject using the motion parameters and evaluating a data consistency quality;
         (iii) evaluating a data consistency parameter to determine whether to iterate through (i) and (ii) for a current set of image voxels or another set of voxels;
      wherein, to jointly estimate motion parameters and reconstruct an image of the subject, the computer is programmed to solve for both the object vector and the motion parameters that describe the object's motion history during the acquisition of the k-space data; and
      wherein, to select a reduced set of voxels, the computer is programmed to determine the reduced set of voxels by adding random motion to an encoding matrix and to identify highly coupled voxels.

13. The MRI system as recited in claim 9, wherein, to select a reduced set of voxels, the computer is programmed to determine the reduced set of voxels by performing an edge detection on the motion-corrupted image.

14. The MRI system as recited in claim 9, wherein, to jointly estimate motion parameters and reconstruct an image of the subject, the computer is programmed to apply a consistency condition over the reduced set of voxels.

15. A magnetic resonance imaging ("MRI") system comprising:
- a magnet system configured to generate a polarizing magnetic field about at least a region of interest ("ROI") of a subject arranged in the MRI system;
- a plurality of gradient coils configured to apply a gradient field with respect to the polarizing magnetic field;
- a radio frequency ("RF") system configured to apply RF excitation fields to the subject and acquire MR image data therefrom; and
- a computer programmed to:
  - control the plurality of gradient coils and the RF system to acquire k-space data from the subject during a time in which the subject was moving;
  - reconstruct a motion-corrupted image of the subject from the k-space data;
  - select a reduced set of voxels in the motion-corrupted image that are coupled;
  - jointly estimate motion parameters and reconstruct an image of the subject that includes less motion that the motion-corrupted image by:
    - (i) estimating the motion parameters associated with motion in the reduced set of voxels:
    - (ii) reconstructing a targeted set of image voxels depicting the subject using the motion parameters and evaluating a data consistency quality:
    - (iii) evaluating a data consistency parameter to determine whether to iterate through (i) and (ii) for a current set of image voxels or another set of voxels;
  - wherein, to jointly estimate motion parameters and reconstruct an image of the subject, the computer is programmed to solve for both the object vector and the motion parameters that describe the object's motion history during the acquisition of the k-space data;
  - wherein, to select a reduced set of voxels, the computer is programmed to identify regions of the motion-corrupted image that are sensitive to motion corruption; and
  - wherein, to identify regions of the motion-corrupted image that are sensitive to motion, the computer is programmed to solve a reconstruction problem using random motion parameter sets.

16. A method for producing an image of a subject using magnetic resonance imaging (MRI), the steps of the method comprising:
- (a) providing k-space data acquired from a subject with an MM system during a time in which at least a portion of the subject is in motion;
- (b) reconstructing a motion-corrupted image of the subject from the k-space data;
- (c) determining a reduced set of voxels in the motion-corrupted image that are coupled by the motion of the subject;
- (d) performing a parallel imaging reconstruction process to jointly estimate motion parameters describing the motion of the subject and reconstruct target image voxels associated with the reduced set of voxels;
- (e) repeating step (c) and step (d) to create an image of the subject from the k-space data that is not corrupted by the motion of the subject; and
- wherein at least one of:
  - step (c) includes adding random motion to the motion-corrupted image to identify pixels that are susceptible to motion; or
  - step (c) includes adding random motion to an encoding matrix and identifying highly coupled voxels.

17. The method as recited in claim 16, wherein step (d) includes evaluating a data consistency quality to determine whether an iteration of step (d) produced target image voxels that are not corrupted by the motion of the subject.

* * * * *

UNITED STATES PATENT AND TRADEMARK OFFICE
CERTIFICATE OF CORRECTION

PATENT NO. : 10,909,732 B2
APPLICATION NO. : 16/073699
DATED : February 2, 2021
INVENTOR(S) : Stephen Cauley et al.

Page 1 of 1

It is certified that error appears in the above-identified patent and that said Letters Patent is hereby corrected as shown below:

In the Specification

Column 7, Line 23, "$\|s\text{-}Ex|_2$" should be --$\|s\text{-}Ex\|_2$--.

In the Claims

Column 11, Claim 1, Line 55, "MM" should be --MRI--.

Column 12, Claim 7, Line 37, "MM" should be --MRI--.

Column 13, Claim 8, Line 8, "MM" should be --MRI--.

Column 16, Claim 16, Line 15, "MM" should be --MRI--.

Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*